United States Patent
Chin et al.

(10) Patent No.: US 10,623,018 B2
(45) Date of Patent: Apr. 14, 2020

(54) METHOD OF ARRANGEMENT OF AN ALGORITHM IN CYCLIC REDUNDANCY CHECK

(71) Applicant: AKRIBIS SYSTEMS PTE LTD, Singapore (SG)

(72) Inventors: Shee Jia Chin, Johor (MY); Yong Min Kong, Singapore (SG)

(73) Assignee: AKRIBIS SYSTEMS PTE LTD, Singapore (SG)

(*) Notice: Subject to any disclaimer, the term of this patent is extended or adjusted under 35 U.S.C. 154(b) by 0 days.

(21) Appl. No.: 15/573,674

(22) PCT Filed: May 20, 2015

(86) PCT No.: PCT/SG2015/050119
§ 371 (c)(1),
(2) Date: Nov. 13, 2017

(87) PCT Pub. No.: WO2016/186571
PCT Pub. Date: Nov. 24, 2016

(65) Prior Publication Data
US 2018/0131388 A1    May 10, 2018

(51) Int. Cl.
*H03M 13/09*    (2006.01)
*G06F 11/10*    (2006.01)
*G06F 17/17*    (2006.01)
*H04L 1/00*    (2006.01)

(52) U.S. Cl.
CPC ....... *H03M 13/091* (2013.01); *G06F 11/1004* (2013.01); *G06F 17/17* (2013.01); *H04L 1/0045* (2013.01); *H04L 1/0057* (2013.01)

(58) Field of Classification Search
CPC .................................................. H03M 13/091
USPC ........................................ 714/757, 752, 755
See application file for complete search history.

(56) References Cited

U.S. PATENT DOCUMENTS

| 8,185,811 B2* | 5/2012 | Li ...................... H03M 13/373 714/795 |
| 2005/0066257 A1 | 3/2005 | Tsai et al. |
| 2005/0114614 A1* | 5/2005 | Anderson ........... G06F 11/1451 711/162 |
| 2005/0149818 A1 | 7/2005 | Tsai et al. |
| 2008/0320370 A1 | 12/2008 | Shinagawa et al. |
| 2011/0314346 A1* | 12/2011 | Vas ........................ H04L 63/06 714/49 |

(Continued)

FOREIGN PATENT DOCUMENTS

EP    0840462 B1    12/2004

OTHER PUBLICATIONS

International Search Report, PCT/SG2015/050119, dated Apr. 22, 2016, 3 pages.

(Continued)

*Primary Examiner* — Fritz Alphonse
(74) *Attorney, Agent, or Firm* — Hauptman Ham, LLP

(57) ABSTRACT

A method of arrangement of an algorithm to calculate cyclic redundancy check (CRC) independent of the length of a polynomial generator and data stream which can be realized in digital implementation with a calculation latency of once clock cycle. The method allows a sequence of information and the corresponding polynomial generator be arranged into a transformation table.

12 Claims, 2 Drawing Sheets

(56) References Cited

U.S. PATENT DOCUMENTS

2014/0281817 A1* 9/2014 Grube ................ G06F 11/1076
714/769
2014/0351624 A1* 11/2014 Resch .................... H04L 67/06
714/6.2

OTHER PUBLICATIONS

International Written Opinion, PCT/SG2015/050119, dated Apr. 22, 2016, 5 pages.
Ming-Der Shien et al., "A Systematic Approach for Parallel CRC Computations", Journal of Information Science and Engineering, vol. 17, pp. 445-461, May 2001.

* cited by examiner

METHOD OF ARRANGEMENT OF AN ALGORITHM IN CYCLIC REDUNDANCY CHECK

RELATED APPLICATIONS

The present application is a National Phase of International Application Number PCT/SG2015/050119, filed May 20, 2015.

FIELD OF THE INVENTION

The present invention pertains to the field of error correction in digital data processing and, more particularly, to an algorithm for generating system to calculate CRC independent of the length of polynomial generator and data stream.

BACKGROUND OF THE INVENTION

Error correction techniques and architectures are well known in digital data processing and communications systems, including systems having data storage subsystems such as magnetic, optical, or semiconductor based memory stores.

Detection and, where possible, correction of erroneous data has been achieved by using an encoder circuit to construct some number of "redundant" m-bit error check symbol, which mathematically characterize the information in a selected block of data. The error check symbol is then appended to the data block and transferred through a communication channel. When the data block is received, or later retrieved from memory, the accuracy or reliability of the data can be evaluated by use of these appended error check symbol.

Cyclic Redundancy check (CRC) is a classical error detection mechanism that is widely known in the art and used in numerous applications as a means to detect errors from a transmitted stream of information. Its general acceptance is due to the simplicity of implementation by which it can be used to encode into a stream of information to be transmitted and subsequently checked at the receiver.

CRC calculation is performed in polynomial arithmetic, whereby the basis of the algorithm is; that given both transmitter and receiver mutually acknowledge the use of the same polynomial generator, which is essentially a sequence of information used to construct and verify the error check symbol (in the context of CRC, it is also known as checksum) from the data stream, a stream of information (also known as packets or frames) is transmitted, whereby calculation of the error check symbol is created by performing polynomial division on the data stream against the chosen polynomial generator.

In prior art, in order to optimize the speed at which the error check symbol can be calculated, some have opted for the solution of deriving Boolean or logical expressions that are valid for specific polynomial generators with fixed data width, while other methodologies optimize the idea of using LFSR (linear feedback shift registers), but instead of single bit shifts, many bits or bytes may be shifted per clock cycle, however this then imposes additional rules for the algorithm. Further still, some methodologies proposed by the prior art attempts to optimize operation of performing CRC by checking for unchanged parts of certain streams of information, while others attempt to improve methodology by calculating partial remainders based on segments of the packet of information.

SUMMARY OF THE INVENTION

The present invention provides a method of arrangement of an algorithm to perform parallel cyclic redundancy check (CRC) comprising the step of: (i) considering a polynomial generator $g(x)=g_{k-1}x_{k-1}+g_{k-2}x^{k-2}+g_{k-2}x^{k-2}+ \ldots g_0$, and $f(x)=m(x)x^{k-1}+c(x);$ and $m(x)=m_{L-1}x^{L-1}+m_{L-2}x^{L-2}+m_{L-2}x^{L-2}+\ldots m_0$; (ii) transforming f(x) and g(x) into a table as a function of each other; (iii) considering an exemplary case whereby k=7 and L=7, obtaining $f_{n-1}=A$, $f_{n-1}=A+B$, $f_{n-1}=A+B+C \ldots f_2=E+F+G$, $f_1=F+G$, $f_0=G$, wherein A, B, C . . . G are divisor coefficient, and (iv) obtaining $c_{k-2}=f_{k-2}$, $c_{k-2}=f_{k-2}\ldots c_1=f_1$, $c_0=f_0$.

It is an object of the present invention to provide a method of arrangement of an algorithm that calculate the checksum used in cyclic redundancy checks, which is generic and independent of the length of the polynomial generator and data stream, and the method can be realized in digital logic implementation limited only by the propagation delay of the slowest synthesized combinatorial logic path and typically calculated within a period of a single system clock cycle.

Another object of the present invention is to provide a method of arrangement of an algorithm that calculates the checksum used in cyclic redundancy check, wherein a sequence of information and the corresponding polynomial generator are transformed into a table to simplify the realization and implementation of the method in synthesizable logic.

These and other objects, aspects, advantages and features of the present invention will be more fully understood and appreciated by those skilled in the art upon consideration of the following detailed description of a preferred embodiment, presented in conjunction with the accompanying drawings.

BRIEF DESCRIPTION OF THE DRAWINGS

It is to be understood that the accompanying drawings are provided for the purpose of illustration only, and are not intended as a definition of the limits of the invention. The drawings illustrate a preferred embodiment of the present invention, in which.

DETAILED DESCRIPTION OF THE PREFERRED EMBODIMENT

CRC calculation is performed in polynomial arithmetic, whereby the basis of an algorithm is given that both the transmitter and the receiver use the same polynomial generator sequence, before a stream of information (also known as packets or frames) is transmitted, calculation will be made against the selected polynomial generator via polynomial division. The remainder of the result of the polynomial division is appended against the original packet of information to be transmitted. Thence when the information is transmitted and received by the receiver, a verification can be made by performing the same polynomial division to the received packet of information and checking if the resultant remainder is equal to zero, and hence an error is easily determined for cases when the remainder is not.

In the present invention, the method is employed to provide a method of arrangement of an algorithm that calculates the checksum used in CRC. With respect to mathematical context, the disclosure above can be explained by the following representation.

Suppose that the data stream is represented by m(x) with coefficients $m_{L-1}, m_{L-2}, \ldots$ and each polynomial degree is represented by $x^{n-1}$ where n is the degree of the polynomial ranging from $\{0, n-1\}$, then the data stream can be said that $$m(x) = m_{L-1}x^{L-1} + m_{L-2}x^{L-2} + m_{L-2}x^{L-2} + \ldots m_0$$

Where L is the length of the data packet.

Additionally the polynomial generator can be similarly represented by $$g(x) = g_{k-1}x^{k-1} + g_{k-2}x^{k-2} + g_{k-2}x^{k-2} + \ldots g_0$$

Where k is the length of the polynomial generator. In the present invention, the CRC checksum calculated can be represented by $$c(x) = c_{k-2}x^{k-2} + c_{k-3}x^{k-3} + c_{k-4}x^{k-4} + \ldots c_0$$

The final frame of information to be transmitted after CRC has been calculated and appended to m(L) can be represented as:

$$f(x) = m(x)x^{k-1} + c(x)$$

And let q(x) be the quotient product of data stream (appended by k-1 bits) and the polynomial generator and m(x) can be rewritten as $$m(x)x^{k-1} = g(x)q(x) + c(x)$$

Where the solution is derived from the following equation:

$$c(x) = \text{remainder}\left(\frac{m(x)x^{k-1}}{g(x)}\right)$$

Figures 1, 2:
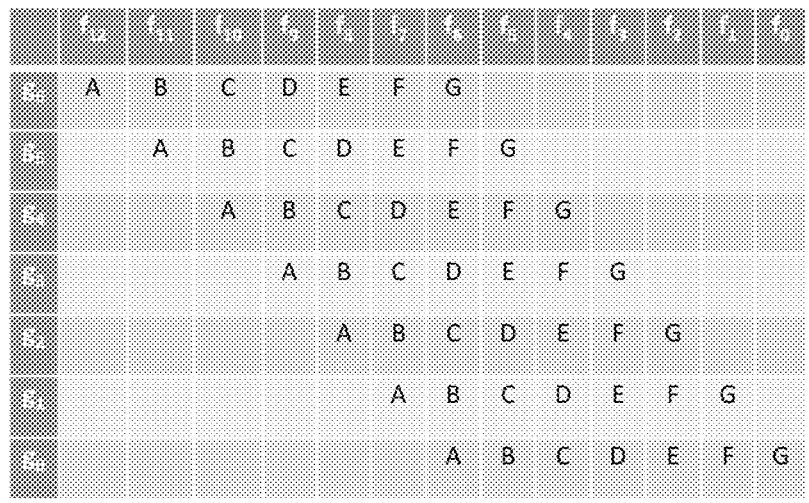
FIG. 1 shows a transformation table embodying a 7 bit data stream and a 7 bit polynomial generator in accordance with the present invention.
FIG. 2 shows an exemplary CRC checksum calculation in accordance with the present invention.
Figure 3:
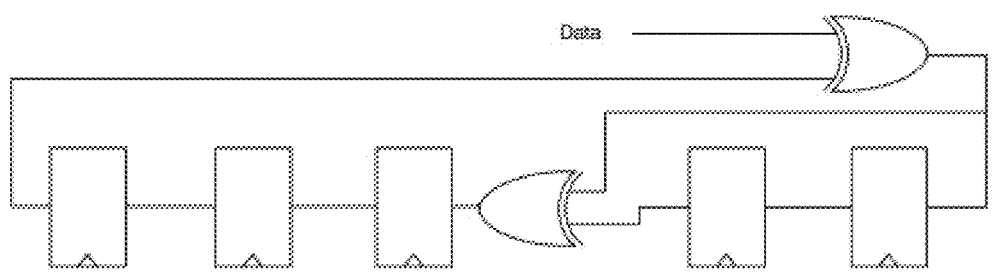
FIG. 3 shows USB CRC5 implementation as LFSR using generator polynomial $G(x)=x^5+x^2+1$ of a conventional method.

In prior art, FIG. 2 shows how c(x) is realized, and it can be seen that the present method of polynomial division infers a need to retain information about the past, in order to bring it forward and eventually arrive at a resultant value by which is the remainder. In digital logic systems, a number of Linear Feedback Shift Registers (LFSR) each corresponding to a degree of the polynomial up to the top most degree associated to the polynomial generator, are cascaded in series with additional Exclusive Or (XOR) logic wherever the degree of the polynomial generator is 1. An example of which can be seen in FIG. 3.

As a result, it would require minimum of k-1 number of clock cycles (where k-1 is the highest degree associated with the polynomial generator) in order to calculate the CRC for a given transmitted stream at the receiver side.

FIG. 1 illustrates an exemplary transformation of a 7 bit data stream and a 7 bit polynomial generator to a table in accordance with the present invention. As shown, the transformation table as described by this present invention of data stream plus CRC check sum (f(x): $f_0, f_1, f_2, f_3 \ldots f_{10}, f_{11}, f_{12}$), against the polynomial generator sequence (g(x): $g_0, g_1 \ldots g_5, g_6$), giving rise to the divisor coefficients A, B ... F, G. The divisor coefficients are used to calculate the CRC sequence in accordance with the present invention.

As shown in FIG. 2, the calculation of long division being performed on the data stream 1100100111 with additional 0000 being appended to the stream from the polynomial sequence 10101 or $x^4 + x^2 + 1$. In the present preferred embodiment, the remainder at the bottom replaces the additional 0000 appended to the data stream as the CRC checksum.

In the preferred embodiment of the present invention, in order to effectively work out the algorithm, f(x) and g(x) are transformed into a table as a function of each other as shown in FIG. 1. Taking an exemplary case of L=7 and k=7 and where the blank spaces are corollary null in value. The mathematical meaning of q(x) becomes meaningless after making the transformation, and it can be seen that coefficients A, B, C ... F, G arise, and let these coefficients be named as divisor coefficients.

Considering a special case where the polynomial generator is such that all the coefficients from the kth degree 0 to 6 are all one, and let n be the length of the data stream plus the length of the CRC check sum (L+(k-1)), it can be derived that $$f_{n-1} = A, f_{n-1} = A+B, f_{n-1} = A+B+C \ldots f_2 = E+F+G, f_1 = F+G, f_0 = G$$

And therefore, $$c_{k-2} = f_{k-2}, c_{k-2} = f_{k-2} \ldots c_1 = f_1, c_0 = f_0$$

If the polynomial generator is not special case, then the derivation above would require an extra multiplication factor based on the row index of the polynomial generator as shown in FIG. 1, with the row of divisor coefficients that have been shifted.

In accordance with the present invention, the algorithm is being used as disclosed to generate a system for CRC checksum which is independent of data or polynomial generator length typically calculated within one clock cycle, limited only by the propagation delay of the slowest synthesized combinatorial logic path.

The generation of the system determines the resultant reminder from performing polynomial division on a data sequence from a configurable polynomial generator without requiring knowledge about the past or having to implement feedback which implies memory. The present invention provides a novel approach by determining the coefficients of the quotient of the result from performing polynomial division by assuming that the remainder is zero, which infers that the remaining k-1 bits of the overall quotient is what would be the remainder of the polynomial division.

Thus, it would be apparent to those skilled in the art that many more modifications are possible without departing from the inventive concepts herein. The invention, therefore, is not to be restricted except in the spirit of the appended claims.

What is claimed is:

1. A method of arrangement of an algorithm to perform parallel cyclic redundancy check (CRC) comprising:
   (i) considering a polynomial generator $g(x)g_{k-1}x^{k-1} + g_{k-2}x^{k-2} + \ldots g_0$, and $f(x) = m(x)x^{k-1} + c(x)$; and $m(x) = m_{L-1}x^{L-1} + m_{L-2}x^{L-2} + m_{L-2}x^{L-2} + \ldots m_0$;
   (ii) transforming f(x) and g(x) into a table as a function of each other;
   (iii) considering exemplary case of k=7 and L=7, obtaining $f_{n-1} = A$, $f_{n-1} = A+B$, $f_{n-1} = A+B+C \ldots f_2 = E+F+G$, $f_1 = F+G$, $f_0 = G$, wherein A, B, C ... G are divisor coefficient, and
   (iv) obtaining $c_{k-2} = f_{k-2}$, $c_{k-2} = f_{k-2} \ldots c_1 = f_1$, $c_0 = f_0$.

2. The method of arrangement of an algorithm of claim 1, wherein in step (iii), the derivation requires an extra multiplication factor based on the divisor coefficients of the polynomial generator, if all the coefficients of g(x) of the polynomial generator is not equal to 1.

3. The method of arrangement of an algorithm of claim 1, wherein the divisor coefficients, A, B . . . F, G are used to obtained CRC checksum from the data stream against the polynomial generator sequence by utilization of the mathematical formulation that can be realized in step (iii).

4. The method of arrangement of an algorithm of claim 1, wherein the algorithm is independent of the length of the polynomial generator and data stream.

5. The method of arrangement of an algorithm of claim 1, wherein the algorithm realized in digital logic implementation is limited in speed only by the propagation delay of the slowest synthesized combinatorial logic path with a typical latency of one system clock cycle.

6. The method of claim 1, wherein the method is implemented in a digital data storage system for error correction.

7. A method of arrangement of an algorithm to perform parallel cyclic redundancy check (CRC) comprising:
(i) considering a polynomial generator g(x) $g_{k-1}x^{k-1} + g_{k-2}x^{k-2} + g_{k-2}x^{k-2} + \ldots g_0$; and $f(x)=m(x)x^{k-1}+c(x)$; and $m(x)=m_{L-1}x^{L-1}+m_{L-2}x^{L-2}+ \ldots m_0$;
(ii) transforming f(x) and g(x) into a table as a function of each other;
(iii) considering exemplary case of k=7 and L=7, obtaining $f_{n-1}=A$, $f_{n-1}=A+B$, $f_{n-1}=A+B+C$ . . . $f_2=E+F+G$, $f_1=F+G$, $f_0=G$, wherein A, B, C . . . G are divisor coefficient, and
(iv) obtaining $c_{k-2}=f_{k-2}$, $c_{k-2}=f_{k-2}$ . . . $c_1=f_1$, $c_0=f_0$, wherein the parallel CRC is performed by a circuit.

8. The method of claim 7, wherein in step (iii), the derivation requires an extra multiplication factor based on the divisor coefficients of the polynomial generator, if all the coefficients of g(x) of the polynomial generator is not equal to 1.

9. The method of claim 7, wherein the divisor coefficients, A, B . . . F, G are used to obtained CRC checksum from the data stream against the polynomial generator sequence by utilization of the mathematical formulation that can be realized in step (iii).

10. The method of claim 7, wherein the algorithm is independent of the length of the polynomial generator and data stream.

11. The method of claim 7, wherein the algorithm realized in digital logic implementation is limited in speed only by the propagation delay of the slowest synthesized combinatorial logic path with a typical latency of one system clock cycle.

12. The method of claim 7, wherein the method is implemented in a digital data storage system for error correction.

* * * * *